United States Patent
Cheng et al.

(10) Patent No.: US 9,177,956 B2
(45) Date of Patent: Nov. 3, 2015

(54) FIELD EFFECT TRANSISTOR (FET) WITH SELF-ALIGNED CONTACTS, INTEGRATED CIRCUIT (IC) CHIP AND METHOD OF MANUFACTURE

(71) Applicant: International Business Machines Corporation, Armonk, NY (US)

(72) Inventors: Szu-Lin Cheng, Yorktown Heights, NY (US); Jack O. Chu, Manhasset Hills, NY (US); Isaac Lauer, Yorktown Heights, NY (US); Jeng-Bang Yau, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 24 days.

(21) Appl. No.: 13/956,339

(22) Filed: Jul. 31, 2013

(65) Prior Publication Data

US 2015/0035060 A1    Feb. 5, 2015

(51) Int. Cl.
| | | |
|---|---|---|
| *H01L 21/00* | (2006.01) | |
| *H01L 27/092* | (2006.01) | |
| *H01L 21/8238* | (2006.01) | |
| *H01L 27/12* | (2006.01) | |
| *H01L 21/84* | (2006.01) | |

(52) U.S. Cl.
CPC ...... *H01L 27/092* (2013.01); *H01L 21/823814* (2013.01); *H01L 21/823871* (2013.01); *H01L 21/84* (2013.01); *H01L 27/1203* (2013.01)

(58) Field of Classification Search
CPC ............... H01L 21/8238–21/823878; H01L 27/0266–27/0281; H01L 27/088; H01L 27/11807; H01L 29/0843–29/0847; H01L 29/4933; H01L 29/4975; H01L 29/7845; H01L 29/78618
See application file for complete search history.

(56) References Cited

U.S. PATENT DOCUMENTS

| | | | |
|---|---|---|---|
| 7,115,465 B2 | 10/2006 | Marty et al. | |
| 7,566,659 B2 | 7/2009 | Bai et al. | |
| 7,602,013 B2 | 10/2009 | Miyano et al. | |
| 7,763,544 B2 | 7/2010 | Bai et al. | |
| 2005/0282363 A1 | 12/2005 | Bai et al. | |
| 2009/0121260 A1* | 5/2009 | Bernstein et al. | 257/255 |
| 2009/0152636 A1* | 6/2009 | Chudzik et al. | 257/369 |
| 2009/0263970 A1 | 10/2009 | Bai et al. | |
| 2012/0032275 A1* | 2/2012 | Haran et al. | 257/401 |
| 2012/0037998 A1* | 2/2012 | Bedell et al. | 257/369 |
| 2013/0062669 A1* | 3/2013 | Chen et al. | 257/288 |
| 2013/0323893 A1* | 12/2013 | Chuang et al. | 438/229 |

* cited by examiner

*Primary Examiner* — David Vu
*Assistant Examiner* — Cuong Nguyen
(74) *Attorney, Agent, or Firm* — Law Office of Charles W. Peterson, Jr.; Louis J. Percello, Esq.

(57) ABSTRACT

Field Effect Transistors (FETs), Integrated Circuit (IC) chips including the FETs, and a method of forming the FETs and IC. FET locations and adjacent source/drain regions are defined on a semiconductor wafer, e.g., a silicon on insulator (SOI) wafer. Source/drains are formed in source/drains regions. A stopping layer is formed on source/drains. Contact spacers are formed above gates. Source/drain contacts are formed to the stopping layer, e.g., after converting the stopping layer to silicide. The contact spacers separate source/drain contacts from each other.

17 Claims, 7 Drawing Sheets

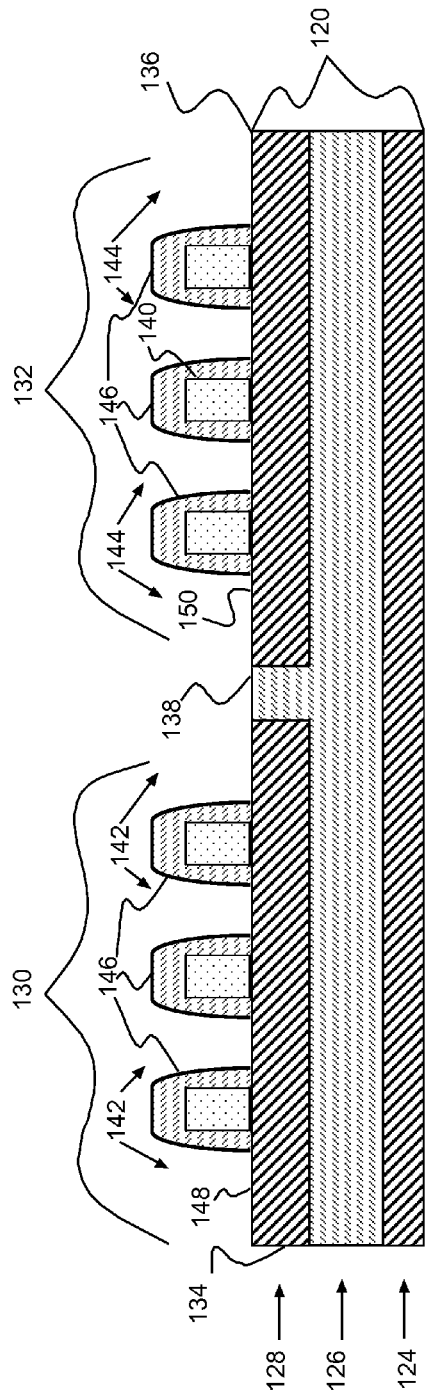
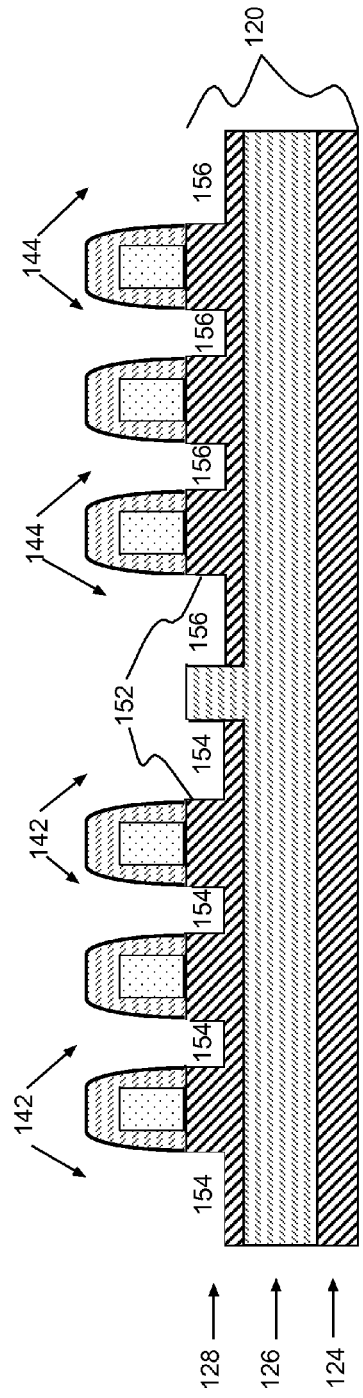
Fig. 3
Fig. 4A

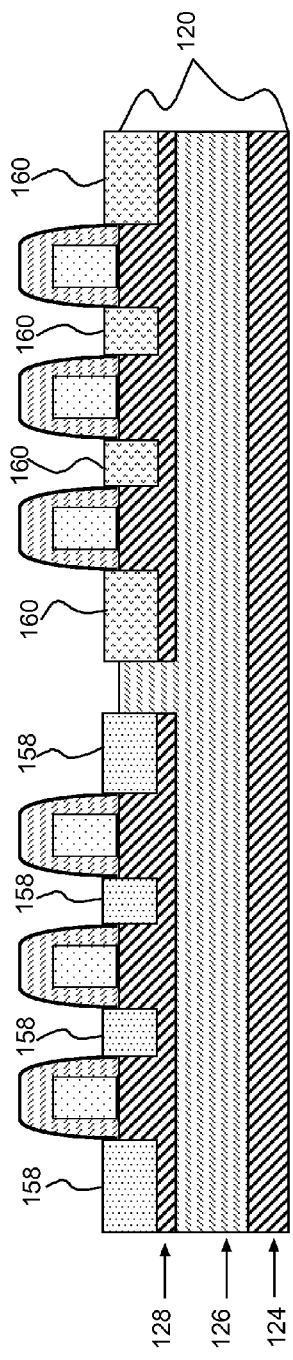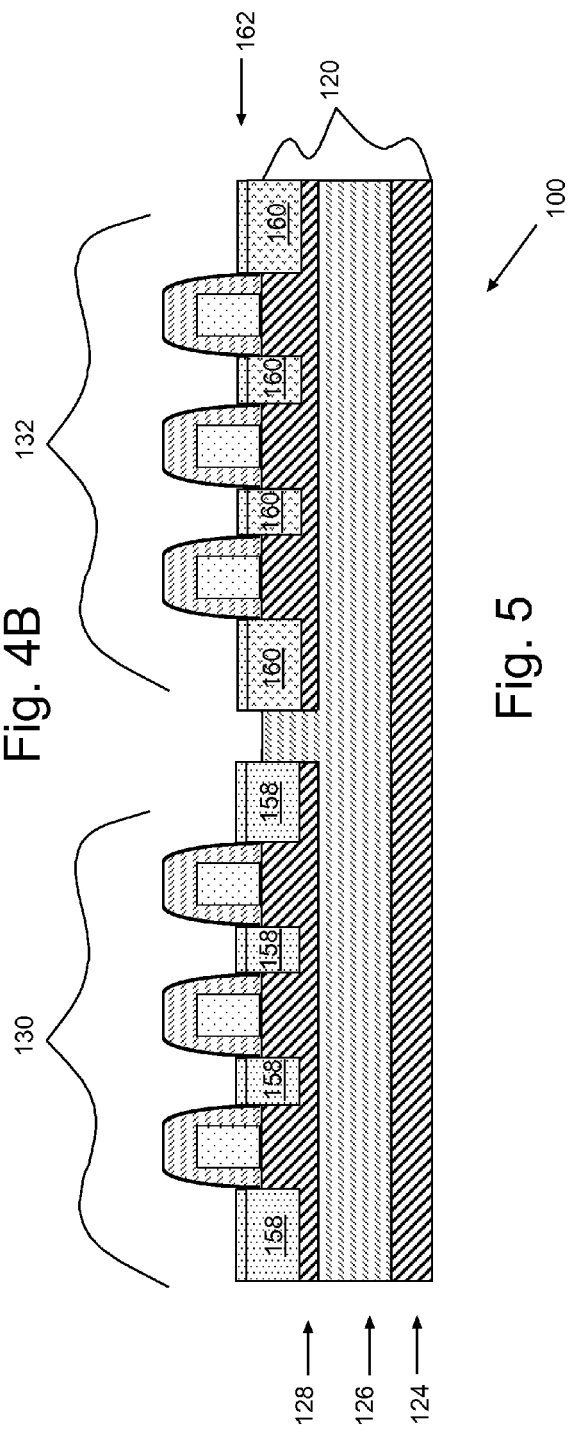

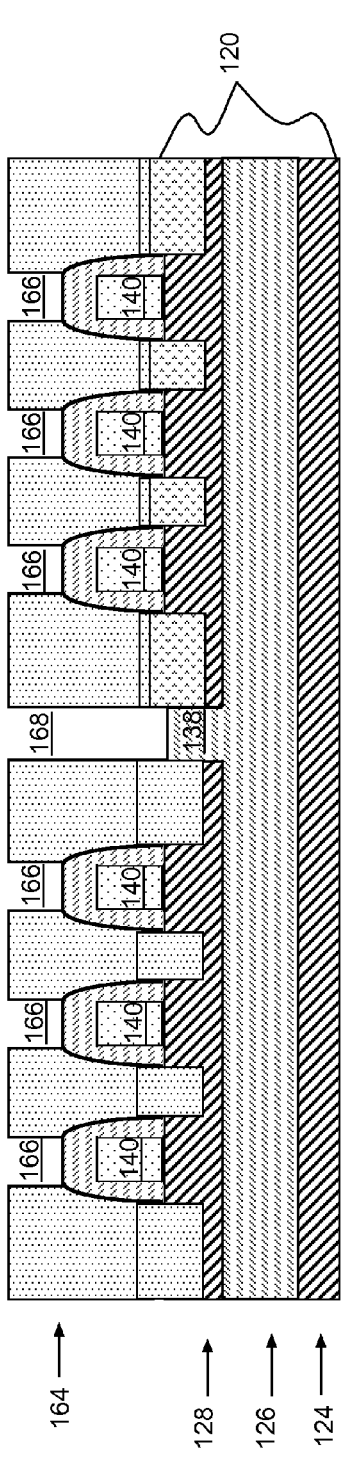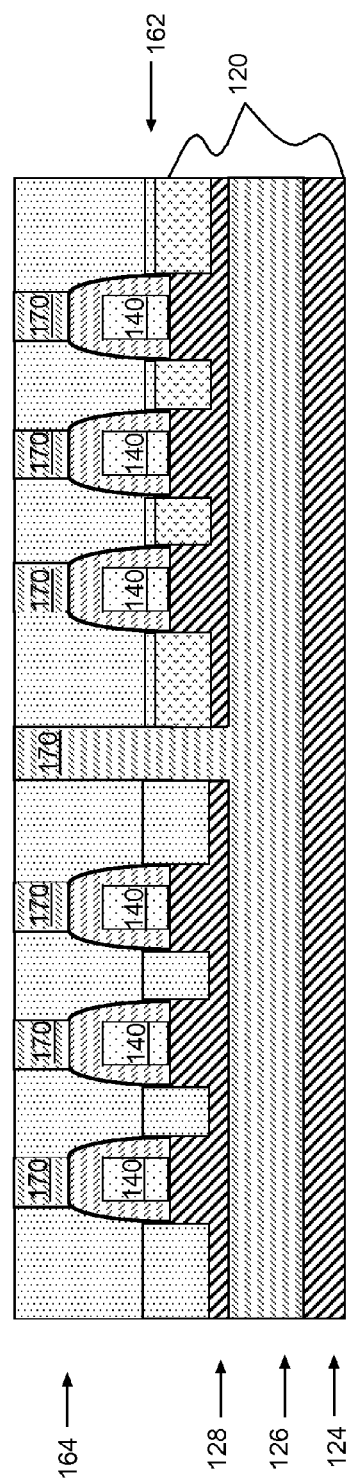

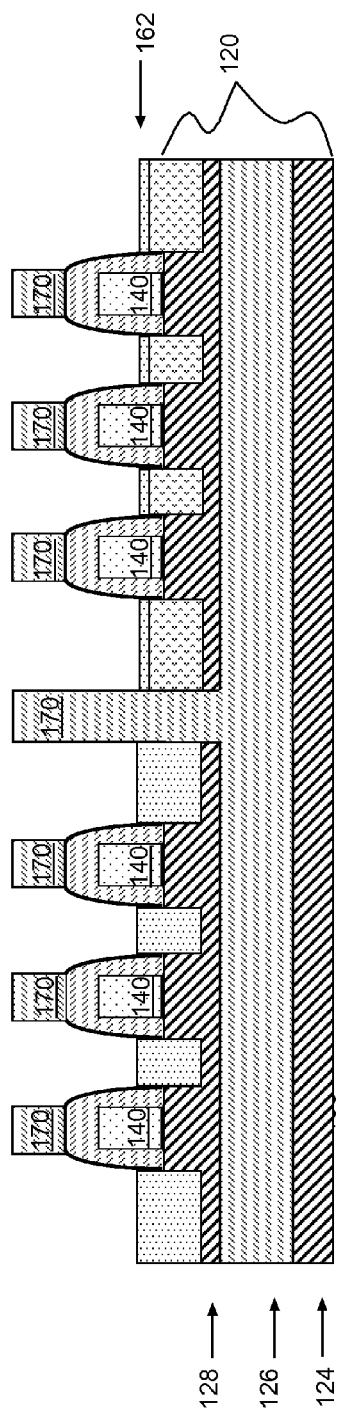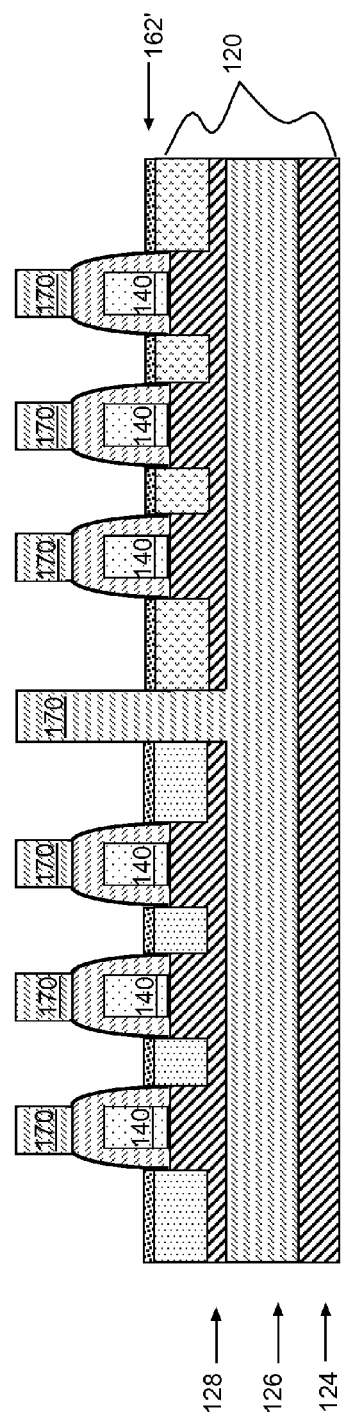

FIELD EFFECT TRANSISTOR (FET) WITH SELF-ALIGNED CONTACTS, INTEGRATED CIRCUIT (IC) CHIP AND METHOD OF MANUFACTURE

BACKGROUND OF THE INVENTION

1. Field of the Invention

The present invention generally relates to semiconductor Field Effect Transistor (FET) manufacture and more particularly to improving yield and reliability in semiconductor chip manufacture.

2. Background Description

Integrated Circuits (ICs) are commonly made in the well-known complementary insulated gate Field Effect Transistor (FET) technology known as CMOS. Typical high performance ICs include CMOS devices (FETs) formed in a number of stacked layers (e.g., wiring, via, gate and gate dielectric) on a surface semiconductor (silicon) layer of a Silicon On Insulator (SOI) chip or wafer. CMOS technology and chip manufacturing advances have resulted in a steady decrease of chip feature size to increase on-chip circuit switching frequency (circuit performance) and the number of transistors (circuit density). In what is typically referred to as scaling, device or FET features are shrunk to shrink corresponding device minimum dimensions, including both horizontal dimensions (e.g., minimum channel length) and vertical dimensions, e.g., channel layer depth, gate dielectric thickness, junction depths and etc. Shrinking device size increases device density and improves circuit performance (both from increased device drive capability and decreased capacitive load).

With scaling, however, what had become small, insignificant and neglectable defects have become significant, to the point of causing chip failures and negatively impacting yield. Scaling has made forming electrical contacts to device source/drain regions, especially for what are known as raised source/drain devices, for example, a considerable challenge. Typically, contacts are formed after opening (smaller and smaller) contact openings or vias through an insulation layer to the device raised source/drains, e.g., using a reactive ion etch (RIE) self-aligned contact, and filling the openings with a conductive material. However, using conventional contact oxide RIE for self-aligned contacts erodes device sidewall spacers that causes gate to source/drain shorts. These shorts have caused a significant drop in chip yield.

Thus, there exists a need for improved self-aligned source/drain contact formation in semiconductor manufacturing, and more particularly; there exists a need for self-aligned source/drain contact formation that does not incur sidewall spacer loss at contact oxide while avoiding source/drain contact to device gate shorts to improve chip yield and reliability.

SUMMARY OF THE INVENTION

An aspect of the invention is improved contact formation in semiconductor manufacturing;

Another aspect of the invention is improved self-aligned raised source/drain (RSD) contact formation in semiconductor manufacturing;

Yet another aspect of the invention is self-aligned raised source/drain (RSD) contact formation that does open contact insulator using RIE and, therefore, does not incur sidewall spacer loss at contact oxide, and further avoids source/drain contact to device gate shorts for improved chip yield and reliability.

The present invention relates to a Field Effect Transistors (FETs), Integrated Circuit (IC) chips including the FETs, and a method of forming the FETs and IC. FET locations and adjacent source/drain regions are defined on a semiconductor wafer, e.g., a silicon on insulator (SOI) wafer. Raised source/drains are formed in source/drains regions. A stopping layer is formed on raised source/drains. Contact spacers are formed above gates, e.g., through a sacrificial layer. Source/drain contacts are formed to the stopping layer, e.g., after converting the stopping layer to silicide. The contact spacers separate source/drain contacts from each other.

BRIEF DESCRIPTION OF THE DRAWINGS

The foregoing and other objects, aspects and advantages will be better understood from the following detailed description of a preferred embodiment of the invention with reference to the drawings, in which:

FIG. 3 shows a cross sectional example of device locations defined on a typical layered wafer;

FIGS. 4A-B a cross sectional example after forming raised source/drains;

FIG. 5 an example of a stopping layer is formed on the raised source/drains;

FIGS. 6A and B show an example of source/drain contact spacer formation;

FIGS. 7A-B show an example of siliciding the raised source/drains;

DESCRIPTION OF PREFERRED EMBODIMENTS

Figure 1:
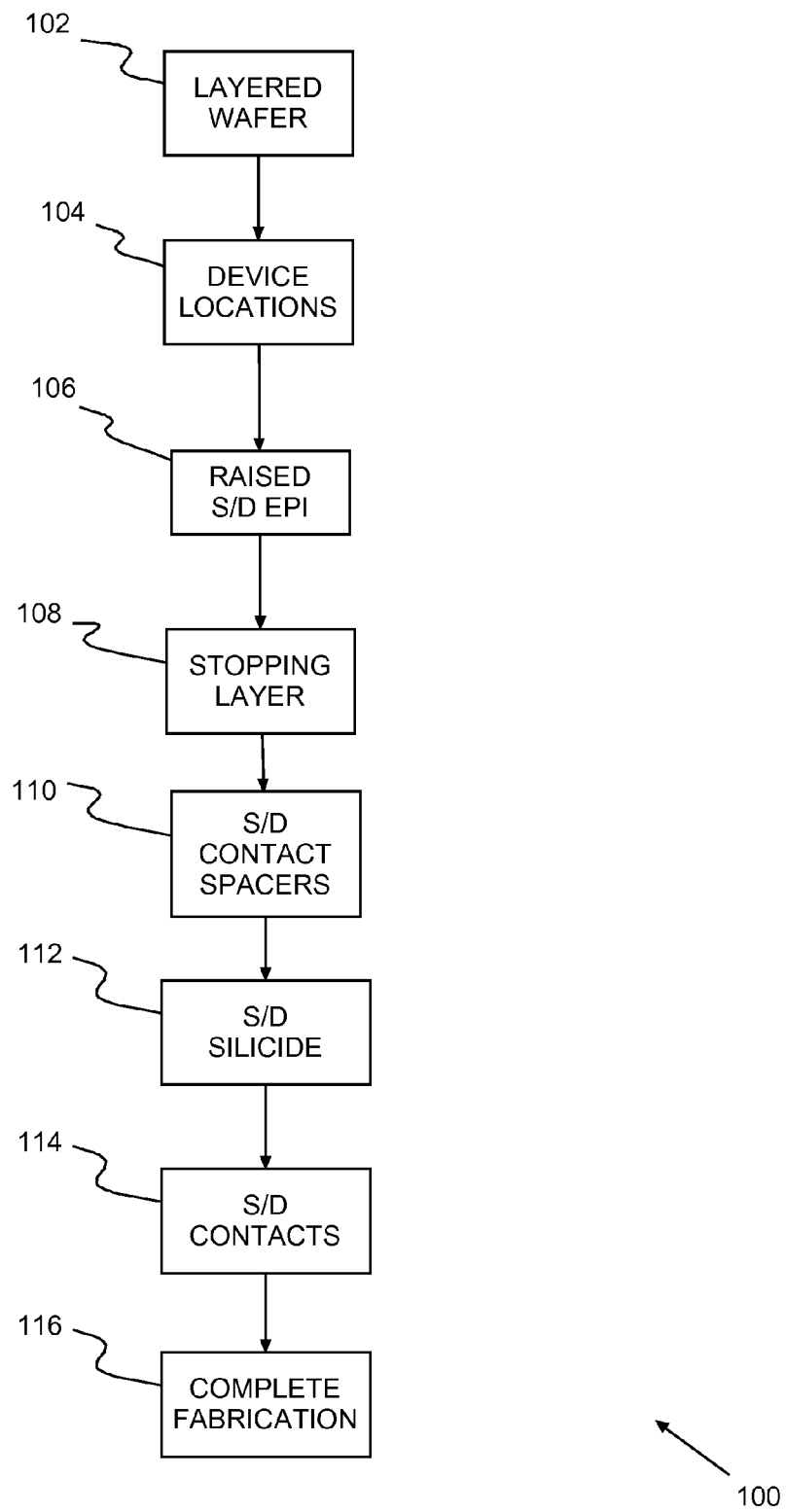
FIG. 1 shows an example of steps in a method for forming device contacts according to a preferred embodiment of the present invention.

Turning now to the drawings and, more particularly, FIG. 1 shows an example of forming 100 source/drain device contacts to semiconductor Field Effect Transistors (FETs), both N-type FETs (NFETs) and P-type FETs (PFETs), according to a preferred embodiment of the present invention. Preferably, the FETs are Raised Source/Drain (RSD) devices in Integrated Circuit (IC) chips formed in the complementary insulated gate technology, commonly referred to as CMOS. Preferably also, the CMOS IC chips are formed on a semiconductor wafer, e.g., a Silicon On Insulator (SOI) wafer. Devices with self-aligned source/drain contacts thus formed avoid spacer loss at contact oxide to prevent lateral shorts that might otherwise occur and improve manufacturing yield and chip reliability.

It is understood that although described in terms of CMOS SOI for example only. The present invention has application to any suitable semiconductor IC material. Thus, the semiconductor wafer may be a bulk semiconductor wafer. Further, the SOI wafer semiconductor substrate may be any suitable III/V semiconductor material or compound such as, for example, silicon (Si), germanium (Ge), SiGe, silicon Carbon (SiC), SiGeC, Gallium Arsenide (GaAs), Indium Phosphorous (InP), InAs, or any combination thereof in a single layer or in a multilayer structure. The insulating layer may be, for example, an oxide or nitride in crystalline or non-crystalline form.

Fabrication begins 102 with a layered wafer and defining 104 device locations on the wafer. Locations may be defined by forming FET gates on the wafer and opening the surface layer to define device areas for P-type and N-type devices, e.g., for Shallow Trench Isolation (STI). Source/drain regions, e.g., for Raised source/drain (RSD), are re-formed 106 adjacent to the FET gates. Next a stopping layer is formed 108 on the source/drain regions. Source/drain contact spacers are formed 110, e.g., above the FET gates to separate subsequently formed source/drain contacts. Silicide is formed 112 on the source/drain regions, e.g., by converting the stopping layer. Source/drain contacts are formed 114 on the silicided the source/drain regions separated by the contact spacers. Finally, normal IC chip fabrication continues normally 116, connecting devices together to form circuits and wiring circuits together to form chips.

Figure 2A:
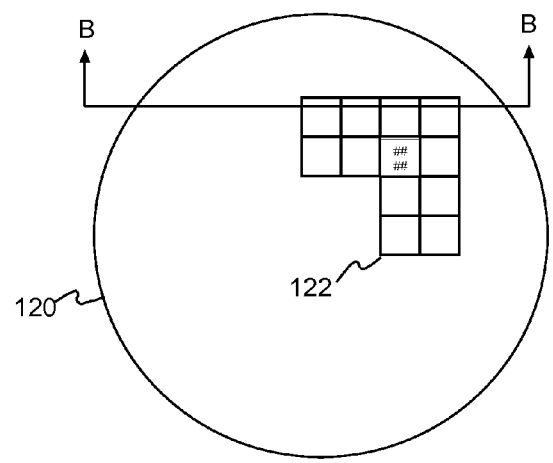
FIGS. 2A-B show an example of a typical wafer and a cross section of the wafer, with chips manufactured on the wafer.
Figure 2B:
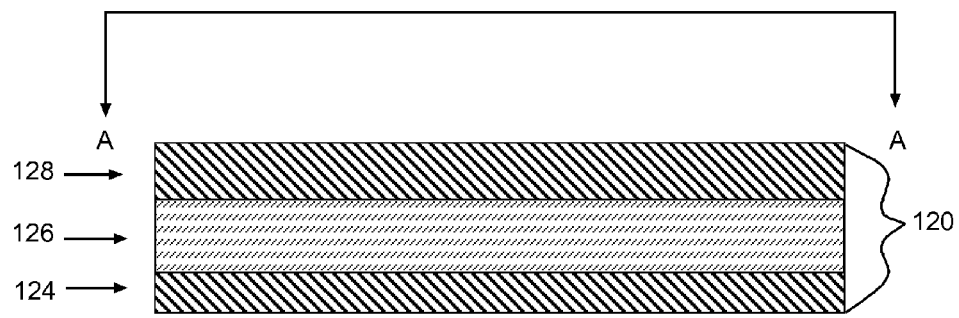

FIGS. 2A-B show an example of a typical wafer 120 and a cross section of the wafer 120 through B-B. In the example of FIG. 2A chips 122 are manufactured on the wafer 120 according to a preferred embodiment of the present invention. Metal lines on upper layers wire chip FETs into chip circuits and wire chip circuits together. One or more of the connected circuits includes at least one preferred FET.

As shown in the cross section of FIG. 2B, a typical layered provided in 102 in FIG. 1, such as wafer 120, includes a substrate 124 supporting an insulating layer 126. The insulating layer 126 supports, and is sandwiched between, a surface semiconductor layer 128 and substrate 124. Preferably, the surface semiconductor layer 128 is a silicon layer of a Silicon on Insulator (SOI) wafer 120. Preferably also, the insulating layer 126 is a buried oxide (BOX) layer.

FIG. 3 shows a cross sectional example of device locations 130, 132 defined on the typical layered wafer, e.g., wafer 120 in FIGS. 2A-B with like features labeled identically. Device location definition (104 in FIG. 1) begins by defining islands 134, 136 in the surface layer. Preferably, a typical shallow trench isolation (STI) technique opens trenches that define the surface layer islands 134, 136 and filling the trenches with insulator 138. Island definition is followed by implanting with a channel tailoring implant, P-type in NFET locations 130 and N-type in PFET locations 132. Alternately, channel implant may be done before segmenting the surface layer.

Device gate 140 formation begins with a gate dielectric layer, less than 20 nm thick depend in on the selected dielectric material, formed on the surface layer 128. A gate layer, 50-150 nm thick, is formed on the gate dielectric layer. Gates 140 are patterned, e.g., using typical state of the art photolithographic patterning (mask and etch) techniques. The gate dielectric, e.g., $HfO_2$, $Al_2O_3$ or $SiO_2$, may be patterned with, before or after patterning the gates 140. Preferably, patterning is done with a hard mask of a dielectric material such as, for example, silicon oxide, silicon nitride, silicon oxynitride, boron nitride, silicon boron nitride or multilayered stacks thereof.

After the gates 140 are patterned, source/drain regions 142, 144 are defined on both sides of the gates 140. Gate caps 146 cap and enclose the gates 149. Preferably the gate caps 146 are a suitable dielectric less than 30 nm wide and preferably 5 nm wide, and formed on and along both sides of the gates 140. Gate caps 146 may be formed, for example, by forming a conformal layer of dielectric material over the gates 140 and patterning photolithographically. The dielectric material may be, for example, silicon oxide, silicon nitride, silicon oxynitride, boron nitride, silicon boron nitride or a multilayered stack thereof. Alternately, the gate caps 146 may be formed by forming a capping layer on the gate and sidewall spacers, e.g., after forming a conformal dielectric layer and a reactive ion etch (RIE) to re-expose the doped island surface 148, 150 in regions 142, 144. Thus, depending on the material(s) used, gate caps 146 may be a uniform single material or two or more materials, i.e., sidewall spacers and caps. Optionally, the gates 140 may be metal gates formed using a typical state of the are replacement gate technology. are formed to mask the top of gates 140

Next in FIGS. 4A-B raised source/drains are formed (106 in FIG. 1) in source/drains regions 142, 144. First, the exposed island surfaces 148, 150 are sub-etched, preferably, 15 nm, exposing channel sidewalls 152 in trenches 154, 156. Then, semiconductor 158, 160 is grown epitaxially in, and refilling, trenches 154, 156. Preferably, in situ phosphorous doped (ISPD) silicon (Si) 158 is grown to fill and extending above the NFET source/drain trenches 154, preferably by 30 nm; and, in situ boron doped (ISBD) silicon Germanium (SiGe) 160 is grown to fill and extending above the PFET source/drain trenches 156, preferably also by 30 nm.

In FIG. 5 stopping layer 162 is formed 108 on the raised source/drains 158, 160. Preferably, the stopping layer 162 is a 1-5 nm thick silicon layer, nominally 1 nm thick, grown doped or undoped on the Si and SiGe raised source/drains 158, 160. It should be noted that the stopping layer 162 merges with source/drain silicon in NFET areas, but remains a separate layer on SiGe raised source/drains 160 in PFET areas.

FIGS. 6A and B show source/drain contact spacer formation, 110 in FIG. 1. First a sacrificial layer 164 is grown on the stopping layer 162. Preferably, the sacrificial layer 164 is SiGe grown selective to the stopping layer 162, such that the SiGe is thick enough that the upper surface is at least 5 nm above the gate caps 146. After stopping layer 162 formation, contact spaces 166 remain open, or are opened, above each gate 140. Stopping layer 162 formation may stop before the layer 162 covers the gate caps 146. Alternately, the contact spaces 166 may be opened, e.g., using typical state of the art mask and etch (e.g., RIE). Since sacrificial layer 164 forms only on the stopping layer 162, contact spaces 168 remain open above shallow trenches 138.

The contact spaces 166, 168 are filled with insulator 170, preferably oxide. Oxide may be deposited on the patterned sacrificial layer 164, and filling the contact spaces 166, 168. Then excess oxide is removed from above, and to, the patterned sacrificial layer 164. For example, a typical chemical-mechanical (chem-mech) polish (CMP) may be used to remove excess dielectric and re-planarize the wafer surface to the patterned sacrificial layer 164. After CMP only contact spacers 170 insulator remains, i.e., the insulator that fills the contact spaces 166, 168.

It should be noted that the sacrificial layer 164 may be a uniform layer or multiple layers of any suitable material, semiconductor, insulating material or conductive material. However, the material must be selected to have an etch rate with a suitable etchant (selective to the sacrificial material) that is different than the stopping layer 162 and the contact spacers 170. In particular the selected material can be doped or undoped germanium, or a semiconductor material that includes doped or undoped germanium, e.g., a silicon germanium ($Si_xGe_y$) alloy where $x=0.20-0.9999$ (20-99.99% by weight) and $y<=1-x$.

FIGS. 7A-B show forming silicide (112 in FIG. 1) on the raised source/drains 158, 160. First, the patterned sacrificial layer 164 material is removed, e.g., using a suitable wet etch that is selective to SiGe. Removing the patterned sacrificial layer 164 re-exposes, and stops on, the stopping layer 162. Then, the stopping layer is converted to silicide 162' on each of the raised source/drains 158, 160.

For example, a highly selective etch can remove the sacrificial material without etching, or only minimally, the stopping layer 162 and contact spacers 170. A typical RCA clean may be used for preparing a germanium-containing sacrificial material, and a Si stopping layer. Alternately, instead of cleaning the wafer in an RCA clean, the sacrificial material may be etched away to the stopping layer 162 in hydrochloric acid (HCl) vapor at 300°-750° C., and preferably at 600° C.

Figure 8:
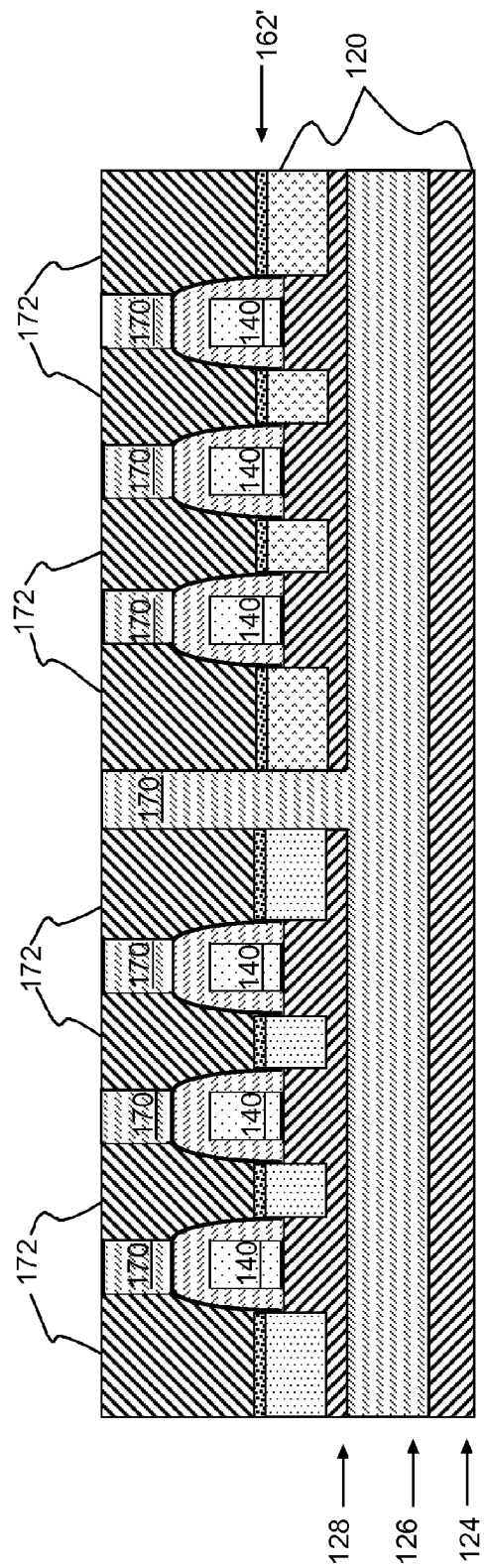
FIG. 8 show an example of source/drain contacts are on the silicided source/drains and separated by the contact spacers.

In FIG. 8 source/drain contact spacers 170 act as a mold for source/drain contacts 172, formed (114 in FIG. 1) on the silicided raised source/drains 158, 160. Preferably metal, e.g., tungsten (W), is deposited on the wafer 120 and planarized to the top of contact spacers 170. Tungsten, for example, may be deposited and partially etched back using a RIE, followed by CMP to complete excess metal removal and replanarize the wafer 120. Once the contacts 172 are complete, IC chip fabrication continues normally 116, forming subsequent, upper level wires connecting devices together to form circuits and wiring circuits together to form chips.

Thus advantageously, self-aligned raised source/drain (RSD) contacts form without using RIE to open contact insulator. Therefore, RSD devices thus formed do not incur sidewall spacer loss at contact oxide, and further avoid source/drain contact to device gate shorts for improved chip yield and reliability.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming Field Effect Transistors (FETs), said method comprising:
    defining FET locations on a semiconductor wafer;
    forming gates in said FET locations, source/drain regions being defined adjacent to said gates;
    forming source/drains in said source/drain regions;
    forming a stopping layer on said source/drains;
    forming a sacrificial layer on said stopping layer, said sacrificial layer extending from said stopping layer above said gates;
    forming contact spacers in spaces in said sacrificial layer above said gates; and
    forming source/drain contacts to said stopping layer, wherein forming said source/drain contacts comprises:
        removing said sacrificial layer, a contact spacer remaining on each of said gates, said stopping layer being re-exposed above said source/drain regions, and
        converting re-exposed said stopping layer to silicide.

2. A method of forming FETs as in claim 1, wherein defining said FET locations comprises:
    implanting FET areas with a channel implant;
    forming a gate in each FET location;
    forming a capping layer on said semiconductor wafer; and
    patterning said capping layer, capping layer material remaining above, and along the sides of, each said gate, said each gate being enclosed above said semiconductor wafer by a cap of remaining said capping layer material.

3. A method of forming FETs as in claim 2, wherein said semiconductor wafer is a layered wafer, implanting said FET areas comprises implanting NFET areas with a P-type dopant and implanting PFET areas with a N-type dopant, and defining said FET locations further comprises segmenting a surface layer of said layered wafer before forming gates.

4. A method of forming FETs as in claim 1, wherein forming said source/drains comprises:
    sub-etching trenches in said semiconductor wafer at said source/drains regions; and
    growing epitaxial semiconductor on said semiconductor wafer, said epitaxial semiconductor filling said trenches at said source/drains regions and extending above the surface of said semiconductor wafer.

5. A method of forming FETs as in claim 4, wherein in situ doped silicon (Si) is epitaxially grown in said trenches in NFET said source/drains regions and in situ doped silicon germanium (SiGe) is epitaxially grown in said trenches in PFET said source/drains regions.

6. A method of forming FETs as in claim 5, wherein said stopping layer is a silicon (Si) layer formed on said in situ doped Si and on said in situ doped SiGe.

7. A method of forming FETs as in claim 1, wherein forming said contact spacers comprises:
    forming an insulator layer on said sacrificial layer, said insulator layer filling said spaces in said sacrificial layer with insulator; and
    removing said insulator layer above said sacrificial layer, said insulator remaining as said contact spacers in filled said spaces.

8. A method of forming FETs as in claim 7, wherein forming said source/drain contacts further comprises:
    forming a conductor layer on said semiconductor wafer covering said contact spacers and silicided source/drains; and
    removing said conductor layer above said contact spacers, source/drain contacts remaining on said silicided source/drains.

9. A method of forming FETs as in claim 8, wherein
    said FETs are N-type and P-type devices in circuits in a CMOS Integrated Circuit (IC) chip, said source/drain contacts form self-aligned to said FETs,
    forming said insulator layer on said sacrificial layer comprises patterning said sacrificial layer to open spaces above said gates, said spaces being filled with insulator remaining as contact spacers on said gates; and wherein
    said method further comprises forming chip wiring connecting said FETs into chip circuits and connecting said chip circuits together.

10. A method of forming CMOS Integrated Circuit (IC) chips, said method comprising:
    defining Field Effect Transistor (FET) locations on a semiconductor wafer;
    forming gates in defined said FET locations;
    forming source/drains adjacent to said gates;
    forming a stopping layer on said source/drains;
    growing a sacrificial layer on said semiconductor wafer, said sacrificial layer extending from said stopping layer above said gates;
    forming contact spacers in spaces in said sacrificial layer above said gates;
    converting said stopping layer to silicide;
    forming source/drain contacts to the silicided source/drains, wherein forming said source/drain contacts comprises:
        removing said sacrificial layer, said contact spacers remaining on said conformal capping layer above said gates, said stopping layer being re-exposed above said source/drain regions, and
        converting re-exposed said stopping layer to silicide; and
    forming chip wiring connecting said FETs into chip circuits and connecting said chip circuits together.

11. A method of forming IC chips as in claim 10, wherein said semiconductor wafer is a layered wafer and defining said FET locations comprises:
- implanting NFET areas with a P-type dopant and implanting PFET areas with a N-type dopant;
- segmenting a surface layer of said layered wafer to define P-type and N-type islands; and
- forming a gate in each FET location on said defined P-type and N-type islands.

12. A method of forming IC chips as in claim 11, wherein forming FET gates comprises:
- forming a gate dielectric layer on said segmented surface layer;
- forming a gate material layer on said gate dielectric layer;
- patterning said gate material layer, gates being defined from patterned said gate material layer;
- forming a conformal capping layer on said segmented surface layer;
- masking said conformal capping layer above defined said gates; and
- etching away unmasked horizontal portions of said conformal capping layer, capping layer caps encasing said gates above said segmented surface layer.

13. A method of forming IC chips as in claim 12, wherein forming said raised source/drains comprises:
- sub-etching trenches in said surface layer at said source/drains regions; and
- growing in situ doped epitaxial silicon (Si) in said trenches in NFET said source/drains regions and in situ doped epitaxial silicon germanium (SiGe) in said trenches in PFET said source/drains regions, said epitaxial Si and said epitaxial SiGe filling said trenches at said source/drains regions, and extending above said surface layer.

14. A method of forming IC chips as in claim 13, wherein said stopping layer is a silicon (Si) layer formed on said in situ doped Si and said in situ doped SiGe, and wherein forming said contact spacers comprises:
- forming an insulator layer on sacrificial layer, said insulator layer filling spaces with insulator; and
- removing said insulator layer above said sacrificial layer, said insulator remaining as said contact spacers in a spaces above each gate.

15. A method of forming IC chips as in claim 14, wherein said sacrificial layer is SiGe and said contact spacers are oxide.

16. A method of forming IC chips as in claim 15, wherein forming said source/drain contacts further comprises:
- depositing metal on said layered wafer covering said oxide contact spacers; and
- removing said metal above said oxide contact spacers, source/drain contacts remaining on said silicide above raised source/drains, separated by said oxide contact spacers.

17. A method of forming IC chips as in claim 16, wherein forming contact spacers comprises patterning said sacrificial layer to open spaces above said gates and said source/drain contacts form self-aligned to said FETs.

* * * * *